(12) United States Patent
Nakayama

(10) Patent No.: US 7,749,325 B2
(45) Date of Patent: Jul. 6, 2010

(54) METHOD OF PRODUCING GALLIUM NITRIDE (GAN) INDEPENDENT SUBSTRATE, METHOD OF PRODUCING GAN CRYSTAL BODY, AND METHOD OF PRODUCING GAN SUBSTRATE

(75) Inventor: Masahiro Nakayama, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 713 days.

(21) Appl. No.: 11/655,884

(22) Filed: Jan. 22, 2007

(65) Prior Publication Data
US 2008/0176386 A1 Jul. 24, 2008

(51) Int. Cl.
*H01L 21/304* (2006.01)

(52) U.S. Cl. .................... 117/97; 117/84; 117/915; 117/952; 438/689; 438/690; 438/691; 438/692

(58) Field of Classification Search ............ 117/84, 117/97, 915, 952; 438/689, 690, 691, 692
See application file for complete search history.

(56) References Cited

U.S. PATENT DOCUMENTS

| | | | |
|---|---|---|---|
| 6,183,345 B1 * | 2/2001 | Kamono et al. | 451/8 |
| 6,566,022 B2 * | 5/2003 | Mizutani et al. | 430/5 |
| 6,652,648 B2 * | 11/2003 | Park | 117/90 |
| 2001/0014570 A1 * | 8/2001 | Wenski et al. | 451/41 |
| 2002/0102819 A1 * | 8/2002 | Tamura et al. | 438/483 |
| 2005/0118938 A1 * | 6/2005 | Mizomoto et al. | 451/65 |
| 2006/0008650 A1 * | 1/2006 | Wesselmann et al. | 428/411.1 |
| 2006/0011135 A1 * | 1/2006 | Dmitriev et al. | 118/718 |

FOREIGN PATENT DOCUMENTS

| | | |
|---|---|---|
| JP | 5-243196 | 9/1993 |
| JP | 10-230443 | 9/1998 |
| JP | 2000-12900 A | 1/2000 |
| JP | 2002-284600 A | 10/2002 |
| JP | 2002-316893 | 10/2002 |
| JP | 2003-168820 A | 6/2003 |
| JP | 2003-243776 | 8/2003 |
| JP | 2006-096588 | 4/2006 |

OTHER PUBLICATIONS

Japanese Office Action, with English Translation, issued in Japanese Patent Application No. JP 2004-282447 dated on Mar. 3, 2009.
Japanese Office Action, with English translation, issued in Japanese Patent Application No. JP 2004-282446, mailed Nov. 18, 2008.

* cited by examiner

*Primary Examiner*—Robert M Kunemund
*Assistant Examiner*—Matthew J Song
(74) *Attorney, Agent, or Firm*—McDermott Will & Emery LLP

(57) ABSTRACT

A method of producing a separated GaN crystal body grown by vapor phase epitaxy on a substrate made of material different from GaN is provided. In this method, a nitride deposit is formed during the growth on a periphery of the substrate and GaN crystal body. The present method comprises the steps of: processing the periphery of the substrate to remove the nitride deposit; and, after the peripheral processing, separating the substrate from the GaN crystal body to make the substrate and the GaN crystal body independent of each other.

5 Claims, 13 Drawing Sheets (A)

| | SAMPLE 1 | SAMPLE 2 | SAMPLE 3 | SAMPLE 4 | SAMPLE 5 | SAMPLE 6 | SAMPLE 7 | SAMPLE 8 | SAMPLE 9 | SAMPLE 10 | SAMPLE 11 | SAMPLE 12 | AVERAGE | DEVIATION | $\sigma$ | $2\sigma$ |
|---|---|---|---|---|---|---|---|---|---|---|---|---|---|---|---|---|
| DECENTERING (mm) | 0.6 | 0.8 | 1.2 | 1.5 | 0.9 | 1.3 | 1.4 | 1.3 | 1 | 1.6 | 1.5 | 1.9 | 1.25 | 0.371 | 1.621 | 1.991 |

(A)

(B)

(C)

METHOD OF PRODUCING GALLIUM NITRIDE (GAN) INDEPENDENT SUBSTRATE, METHOD OF PRODUCING GAN CRYSTAL BODY, AND METHOD OF PRODUCING GAN SUBSTRATE

BACKGROUND OF THE INVENTION

1. Field of the Invention

The present invention relates to a method of producing a GaN independent substrate, a method of producing a GaN crystal body, and a method of producing a GaN substrate.

2. Related Background Art

Document 1 (Japanese Patent Application Laid-Open No. 2000-12900) describes a GaN single-crystal substrate. A mask having zigzag windows or stripe windows is formed on a GaAs (111) substrate, a GaN buffer layer is formed at low temperature by HVPE or by MOC, a thick GaN epitaxial layer is grown at high temperature by HVPE, and the GaAs substrate is then removed. By using the self-sustained films of GaN as seed crystals, a thick GaN is grown by HVPE to form a GaN ingot. This ingot is sliced with a slicer to obtain a transparent and colorless GaN wafer with little warp.

Document 2 (Japanese Patent Application Laid-Open No. 2002-284600) describes a method of producing a GaN crystal substrate, and a GaN crystal substrate. A metal film is deposited on a starting base which is one of the following: a single-crystal sapphire substrate; a substrate obtained by growing a single-crystal GaN film on a sapphire substrate; and a single-crystal semiconductor crystal substrate. A GaN film is then deposited on the metal film to form a laminated substrate, which facilitates separation of the grown GaN film and the starting base.

Document 3 (Japanese Patent Application Laid-Open No. 2003-168820) describes a method of separating a crystal layer formed on a substrate by exposing the crystal layer and the substrate to light. This separation method is characterized by irradiating the layer with a line pattern of light. At this time, the irradiation width with the light is approximately equal to or smaller than the thickness of the crystal layer, whereby the crystal layer can be separated from the substrate, without occurrence of crack.

SUMMARY OF THE INVENTION

In the fabrication of the GaN independent substrate, the GaN film is grown on the GaAs substrate and thereafter GaAs is removed by etching to form the self-sustained GaN crystal body. During the growth of the GaN crystal body on the GaAs substrate, a nitride deposit is grown on the periphery of the GaN crystal body and the GaAs substrate. Even if the GaAs substrate is removed by wet etching after the growth of the GaN crystal body, there remain deposit projecting outward from the periphery of the GaN crystal body. Therefore, the GaN crystal body cannot be shaped before the removal of the projections. However, in order to remove this projecting deposit, it is necessary to perform substantially manual processing. What is needed is to efficiently remove the nitride deposit from the periphery of the GaN crystal body and the GaAs substrate and thereby achieving further improvement in productivity.

As described above, Document 2 discloses that the GaN film is grown through the aluminum film evaporated on the sapphire substrate and that the aluminum evaporated film is dissolved by etching (HCl+$H_2O_2$) to obtain the self-sustained GaN film. Document 3 discloses that the GaN film is grown on the sapphire substrate and that the sapphire substrate is irradiated with the linear pattern of laser beam to separate the GaN film from the substrate, whereby stress is relaxed to prevent the GaN film from cracking. These techniques disclosed in the above documents are different from the removal of the nitride deposit from the periphery of the GaN crystal body and the GaAs substrate.

The present invention has been accomplished in view of the above-discussed matter and an object of the invention is to provide a method of producing a GaN independent substrate, a method of producing a GaN crystal body, and a method of producing a GaN substrate, which relate to the efficient removal of the nitride deposit formed on the periphery of the GaN crystal body and the GaAs substrate.

One aspect of the present invention is a method of producing a GaN independent substrate from a GaN crystal body grown by vapor phase epitaxy on a substrate made of material different from GaN, and during the growth, a nitride deposit is formed on a periphery of the substrate and GaN crystal body. The method comprises the steps of: processing the periphery of the substrate and GaN crystal body to remove the nitride deposit; and after the peripheral processing, separating the substrate from the GaN crystal body to form a GaN independent substrate by making the substrate and the GaN crystal body independent of each other.

In this method according to the present invention, the step of processing the periphery of the substrate and GaN crystal body to remove the nitride deposit comprises removing the nitride deposit with a grinding stone while rotating the GaN crystal body about a predetermined axis.

In the method according to the present invention, the step of processing the periphery of the substrate and GaN crystal body to remove the nitride deposit comprises the steps of: processing the nitride deposit with a first grinding wheel having a first stiffness; and, after processing the nitride deposit with the first grinding wheel, processing the nitride deposit with a second grinding wheel having a second stiffness. The first stiffness is greater than the second stiffness.

In the method according to the present invention, in each of the processing steps with the first and second grindings, the nitride deposit is removed by the peripheral processing while oscillating one of the GaN crystal body and the grinding wheel relative to the other in a direction the predetermined axis.

In the method according to the present invention, the step of removing the nitride deposit and GaN crystal body comprises an initial step and a finish step, and a feed speed of the grinding wheel in the initial step is different from a feed speed of the grinding wheel in the finish step.

Another aspect of the present invention is a method of producing a GaN crystal body for forming a GaN substrate. This GaN crystal body is grown by vapor phase epitaxy on a substrate made of material different from GaN, and as the result of the growth, a nitride deposit is formed on a periphery of the substrate and GaN crystal body. The method comprises the step of: grinding a peripheral part of the nitride deposit by machining to remove a first outer periphery part of the nitride deposit on the side face of the GaN crystal body and a second outer periphery part of the nitride deposit on the side face of the substrate. In this step, a first inner periphery part of the nitride deposit is left on the side face of the GaN crystal body and a second inner periphery part of the nitride deposit is left on the side face of the substrate. The method further comprises the steps of: after the grinding by machining, removing the substrate by etching; after removing the substrate, removing the second inner periphery part of the nitride deposit; and, after the removal of the second inner periphery part, removing the first inner periphery part of the nitride deposit by machining to form the GaN crystal body.

In this method according to the present invention, after the peripheral part of the nitride deposit has been ground, the inner periphery part of the nitride deposit and the GaN crystal body have a size within a circular cylinder of a predetermined diameter, the predetermined diameter is larger than a diameter of the substrate, and the difference between the predetermined diameter and the substrate diameter is equal to or more than one millimeter and equal to or less than four millimeters.

In the method according to the present invention, after the peripheral part of the nitride deposit has been ground, the inner periphery part of the nitride deposit and the GaN crystal body have a size within a circular cylinder of a predetermined diameter. The predetermined diameter is larger than a diameter of the substrate, and the difference between the predetermined diameter and the substrate diameter is equal to or more than one millimeter and equal to or less than three millimeters.

In the method according to the present invention, the grinding by machining comprises removing the nitride deposit by use of a grinding stone while rotating the GaN crystal body about a predetermined axis.

Still another aspect of the present invention is a method of producing a GaN substrate from a GaN crystal body grown by vapor phase epitaxy on a substrate made of material different from GaN, and in the growth, a nitride deposit is formed on a periphery of the substrate and GaN crystal body. The method comprises the step of: grinding a peripheral part of the nitride deposit by machining to remove a first outer periphery part of the nitride deposit on the side face of the GaN crystal body and a second outer periphery part of the nitride deposit on the side face of the substrate. In this step, a first inner periphery part of the nitride deposit is left on the side face of the GaN crystal body and a second inner periphery part of the nitride deposit is left on the side face of the substrate. The method further comprises the steps of: after the grinding by machining, removing the substrate by etching; after the removal of the substrate, removing the second inner periphery part of the nitride deposit; after the removal of the second inner periphery part, removing the first inner periphery part of the nitride deposit by machining to form the GaN crystal body; and fabricating one or more GaN substrates from the GaN crystal body.

BRIEF DESCRIPTION OF THE DRAWINGS

The above object and other objects, features, and advantages of the present invention will become apparent more readily in view of the following detailed description of the preferred embodiments of the present invention with reference to the accompanying drawings.

FIG. 12 is a view showing eccentricity in the peripheral processing.

DETAILED DESCRIPTION OF THE PREFERRED EMBODIMENTS

The teaching of the present invention can be readily understood in view of the following detailed description with reference to the accompanying drawings presented by way of example. Subsequently, embodiments of a method of producing a GaN independent substrate according to the present invention will be described with reference to the accompanying drawings. This method is to produce a GaN independent substrate from a GaN crystal body grown by vapor phase epitaxy on a substrate made material different from GaN. The same portions will be denoted by the same reference symbols as much as possible.

Figure 1:
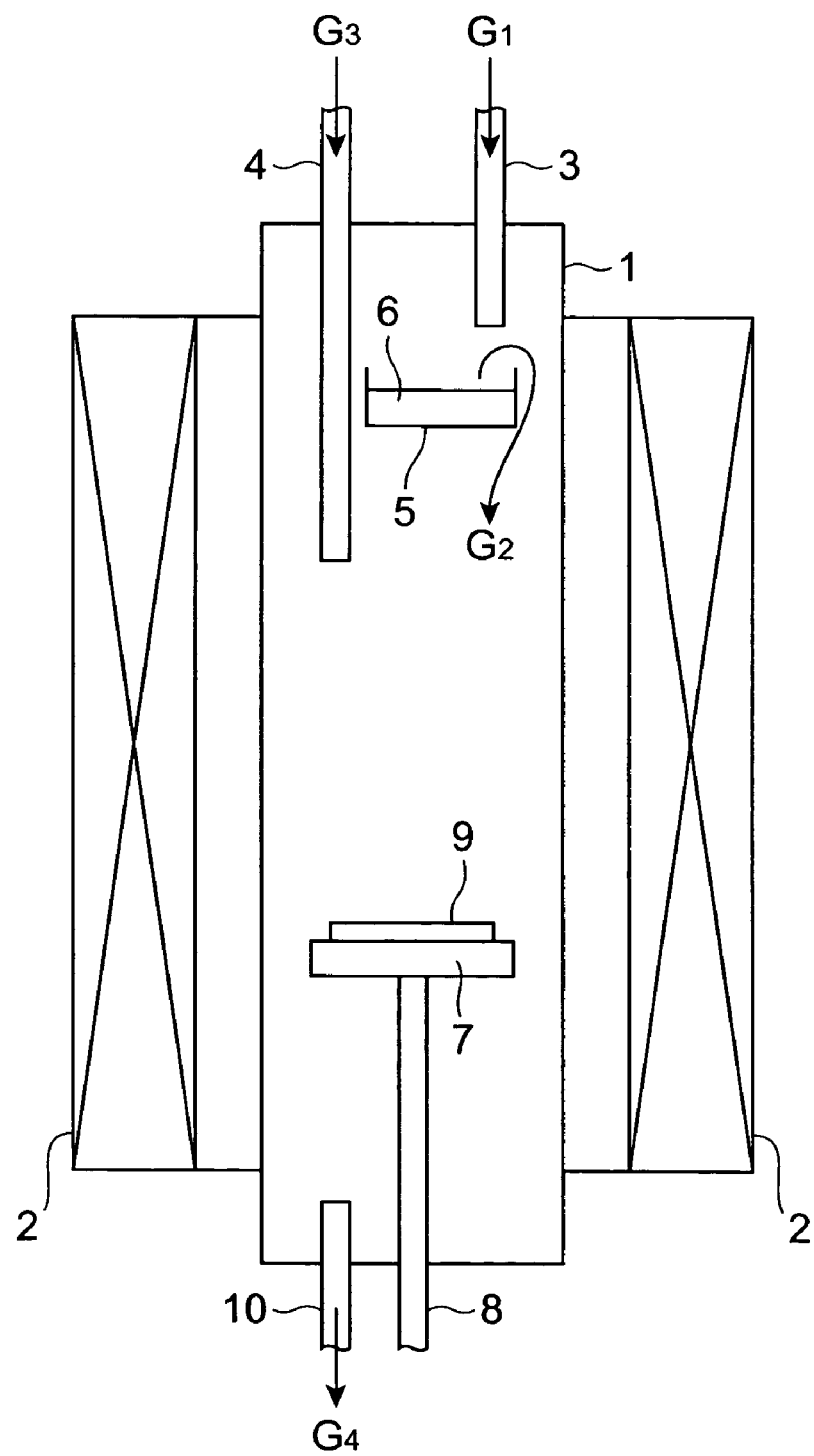
FIG. 1 is a view showing a film forming apparatus, according to an embodiment of the present invention, for vapor phase epitaxy such as HVPE used for epitaxial growth.

FIG. 1 shows a deposition apparatus for vapor phase epitaxy such as HVPE used for epitaxial growth in an embodiment according to the present invention. A vertical reactor 1 is surrounded by a cylindrical heater 2. Source gas inlets 3, 4 are located in the top part of the reactor 1. Mixed gas $G_1$ of hydrogen chloride (HCl) as a source gas and hydrogen ($H_2$) as a carrier gas is introduced through the gas inlet 3 into the reactor 1. A gallium (Ga) source 5 is opposed to the inlet 3. Metal gallium is charged in the source board and, when heated by the heater 2, it turns into a Ga melt 6 because the melting point of metal gallium is low. When HCl arrives at the Ga melt, the reaction of $2Ga+6HCl \rightarrow 2GaCl_3+3H_2$ occurs and gallium chloride ($GaCl_3$) is produced thereat. Mixed gas $G_2$ of gallium chloride and carrier gas $H_2$ is provided in the space inside the reactor 1. Mixed gas $G_3$ of ammonia ($NH_3$)+ hydrogen ($H_2$) is introduced through the inlet 4 into the reactor 1. Through the reaction of $GaCl_3$ and $NH_3$ in the source gas, gallium nitride (GaN) is deposited on a substrate 9.

A susceptor 7 is supported by a shaft 8 so as to allow free rotation and up-and-down motion. The substrate, such as a GaAs, substrate 9 is placed on the susceptor 7. The GaAs substrate 9 is of inch size and is of an approximate disk shape having the diameter of two inches, for example. A product GaN is deposited on the principal surface of the substrate 9. Mixed gas $G_4$ of the remainder of the source gas and the reaction product gas is discharged through a waste gas outlet 10. A GaN crystal body made by HVPE demonstrates the n-conductivity type even when undoped. The carrier concentration of the GaN crystal body is, for example, approximately $1 \times 10^{16}$ $cm^{-3}$. After the temperature of the deposition apparatus is lowered to room temperature, the complex of the GaAs substrate 9 and the GaN crystal body grown thereon is taken out of the apparatus. The thickness of the GaN crystal body is larger than the thickness of the substrate 9.

Figure 2:
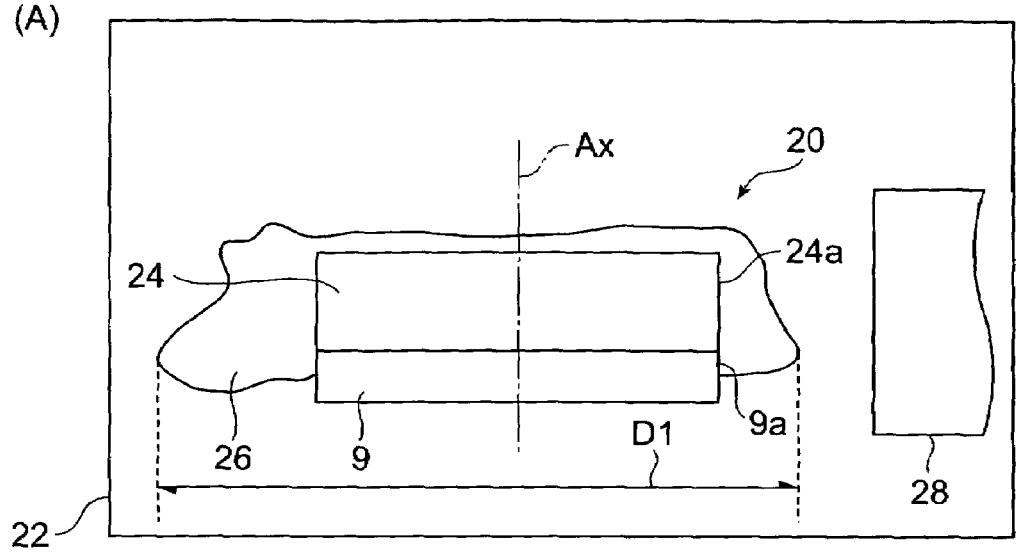
FIG. 2 is a view showing primary steps in a method of producing a GaN independent substrate. Part (A) of FIG. 2 shows a peripheral processing apparatus for performing a step of removing a nitride deposit by peripheral processing, part (B) of FIG. 2 shows a step of removing the nitride deposit, and a step of separating the substrate from a GaN crystal body, and part (C) of FIG. 2 shows a step of separating the substrate from a GaN crystal body.
Figure 2:
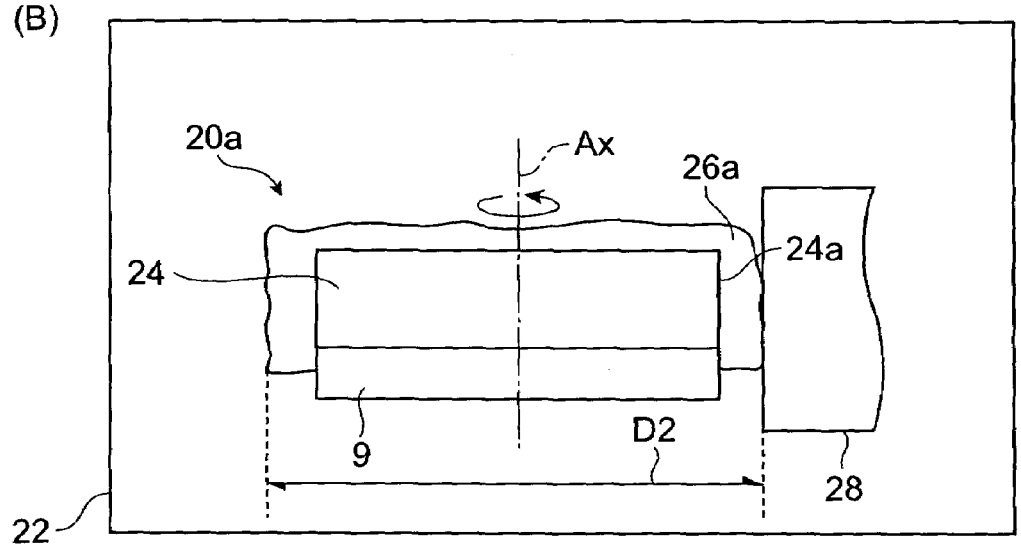
Figure 2:
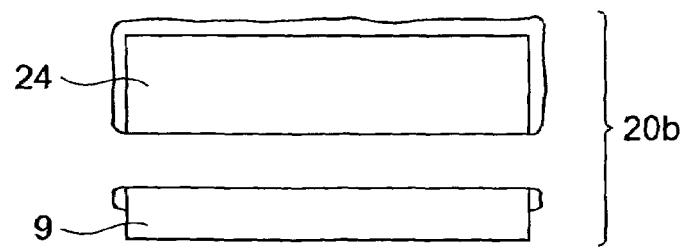

Part (A) in FIG. 2 shows a peripheral processor for carrying out a step of removing a nitride deposit by peripheral processing. A complex 20 includes a GaAs substrate 9, a GaN crystal body 24, and a nitride deposit 26. For example, the GaN crystal body 24 of a cylinder shape is deposited on the substrate 9 of the disk shape. In conjunction with the growth of the GaN crystal body 24, the nitride deposit 26 is inevitably formed on each of the side faces 9a, 24a of the substrate 9 and the GaN crystal body 24. The nitride deposit 26 has a projection located outside a virtual cylindrical shape having the diameter of the substrate 9. The complex 20 is mounted on the peripheral processor 22 so as to be rotatable about a predetermined axis Ax. The peripheral processor 22 has, for example, a grinding stone 28 as a grinding tool for machining the periphery of the complex 20. The complex 20 has the dimension represented by symbol D1.

Part (B) in FIG. 2 is a view showing a peripheral processing step. While the complex 20 is rotated about the predetermined axis Ax, the grinding wheel 28 is brought into contact with the periphery of the complex 20. As the grinding wheel 28 is moved, for example reciprocated, at an appropriate feed speed, the periphery of the complex 20 is gradually ground. Namely, the nitride deposit 26 is gradually removed. Referring to part (B) in FIG. 2, the grinding changes the nitride deposit 26 on the periphery of the complex 20 to a nitride deposit 26a, and the dimension D2 of the complex 20 is made smaller than the diameter "D1." The periphery of the complex 20 is ground using the peripheral processor 22 to the diameter of 50 millimeters, for example. This grinding results in removing projecting portions. In the complex 20a shown in part (B) in FIG. 2, a small amount of the nitride deposit is left on the side faces of the substrate 9 and the GaN crystal body 24, and the nitride deposit is completely removed.

As shown in part (C) in FIG. 2, after the peripheral processing, the substrate 9 in the complex 20b is mechanically separated from the GaN crystal body 24. This separation results in making the substrate 9 and the GaN crystal body 24 independent of each other. The separation can be carried out, for example, as follows. Since the nitride deposit is removed, a border between the GaN crystal body 24 and the substrate 9 is exposed. When a force is applied to this border, the complex 20b is separated into the substrate 9 and the GaN crystal body 24. This provides the GaN crystal body 24 for formation of GaN wafers.

Since this method is arranged to remove the nitride deposit 26 prior to the separation of the substrate 9 from the GaN crystal body 24, the nitride deposit 26 can be removed by peripheral processing.

Figure 3:
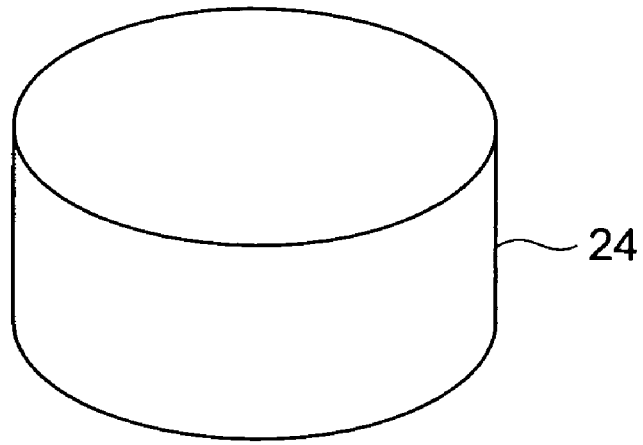
FIG. 3 is a view showing an independent GaN crystal body after a nitride deposit has been removed, and GaN wafers made from this GaN crystal body, parts (A) and (B) of FIG. 3 show the independent GaN crystal body formed by removing the nitride deposit, and the GaN wafers made from the GaN crystal body, respectively.
Figure 3:
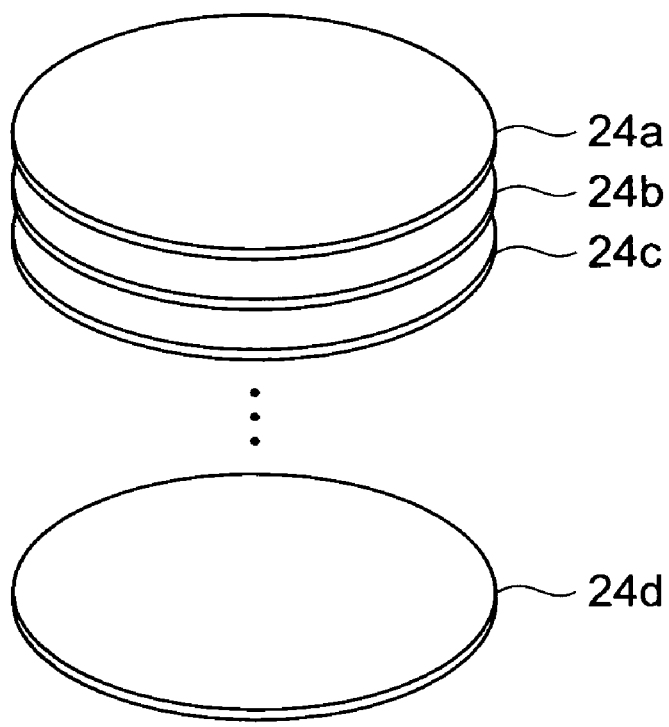

Part (A) in FIG. 3 shows the GaN crystal body that the nitride deposit has been removed and has been separated from the substrate 9 to be independent. The GaN crystal body 24 has been processed so as to have a desired diameter, and, as shown in part (B) in FIG. 3, the GaN crystal body 24 is sliced and polished to obtain one or more GaN wafers 24a-24d.

Example 1

A GaN film about 3 mm thick was deposited on a GaAs substrate having the diameter of 50 mm to form a complex. The outside diameter of the complex was 58 mm because of the nitride deposit. The periphery of the complex was ground at the peripheral speed of 2000 mm/min with a resin bonded grinding wheel (which is a grinding wheel obtained by binding diamond grains with resin) #600, and, after grinding the complex from its outside diameter of 58 mm to 49.5 mm, the GaN crystal body was separated from the GaAs substrate. The time required for the grinding was 80 minutes.

Another complex having the outside diameter of 58 mm because of the nitride deposit was processed using a straight type of metal bonded diamond wheel (which is a grinding wheel obtained by sintering diamond grains with metal powder). The time required for the grinding was 80 minutes. No crack was observed in the initial stage of processing, but several cracks were observed around the substrate at the time of completion of the processing. In general, metal bonded grinding wheels have greater wear resistance and are thus more advantageous in terms of lifetime than soft resin bonded grinding wheels. But, the metal bonded grinding wheels cause greater damage to products because of its high stiffness than the soft resin bonded grinding wheels. Vitrified grinding wheels (which are a grinding wheel obtained by sintering diamond grains with alumina) have much the same properties as the foregoing metal bonded grinding wheels.

Figure 4:
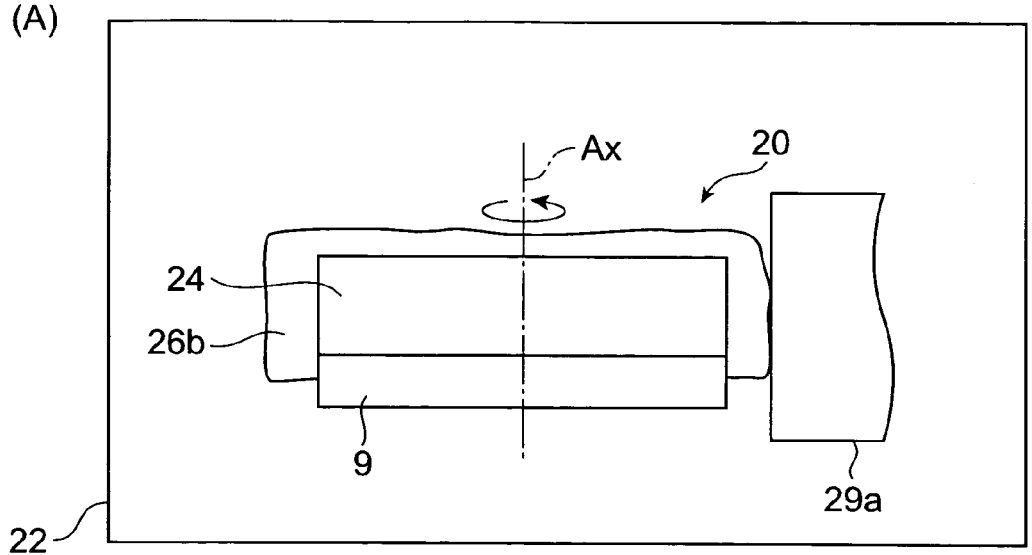
FIG. 4 is a view showing an example of the peripheral processing step, and each of parts (A) and (B) shows the peripheral processing step.
Figure 4:
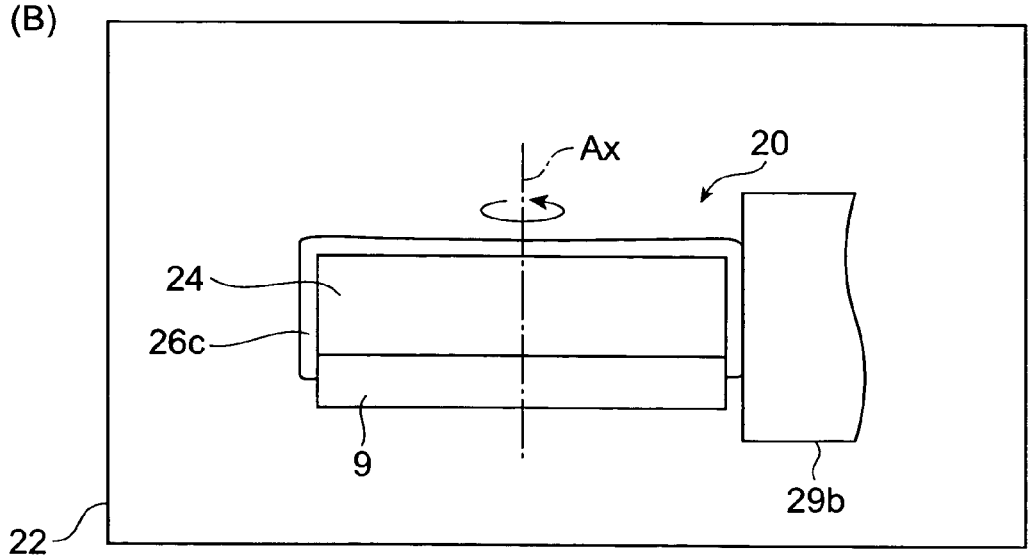

Part (A) and part (B) in FIG. 4 show an example of the peripheral processing step. As shown in part (A) of FIG. 4, the peripheral processing step is to process the complex 20 with a first grinding wheel 29a having a first stiffness. This processing results in grinding the nitride deposit 26 of the complex 20 to nitride deposit 26b. Then the nitride deposit 26b is processed with a second grinding wheel 29b having a second stiffness. This processing results in grinding the nitride deposit 26b of the complex 20 to nitride deposit 26c, as shown in part (B) in FIG. 4. The first stiffness is greater than the second stiffness. The inner peripheral region of the nitride deposit, different from the outer peripheral region, is adjacent to the GaN crystal body that will be processed into products. Therefore, the inner peripheral region and the outer peripheral region are ground using the respective grinding wheels so as to reduce damage to products, if necessary.

Example 2

A GaN film about 3 mm thick was deposited on a GaAs substrate having the diameter of 50 mm to prepare a complex. The outside diameter of the complex was 58 mm because of the nitride deposit. First, the portion, 80%, of the grinding process was conducted at the peripheral speed of 2000 mm/min with a vitrified grinding wheel. Then, the rest, 20%, of the grinding process was ground at the peripheral speed of 2000 mm/min with a resin bonded grinding wheel. The time required for the grinding was 80 minutes. No crack was observed. After grinding the complex to the desired dimension to form the GaN crystal body, the GaN crystal body was separated from the GaAs substrate.

Figure 5:
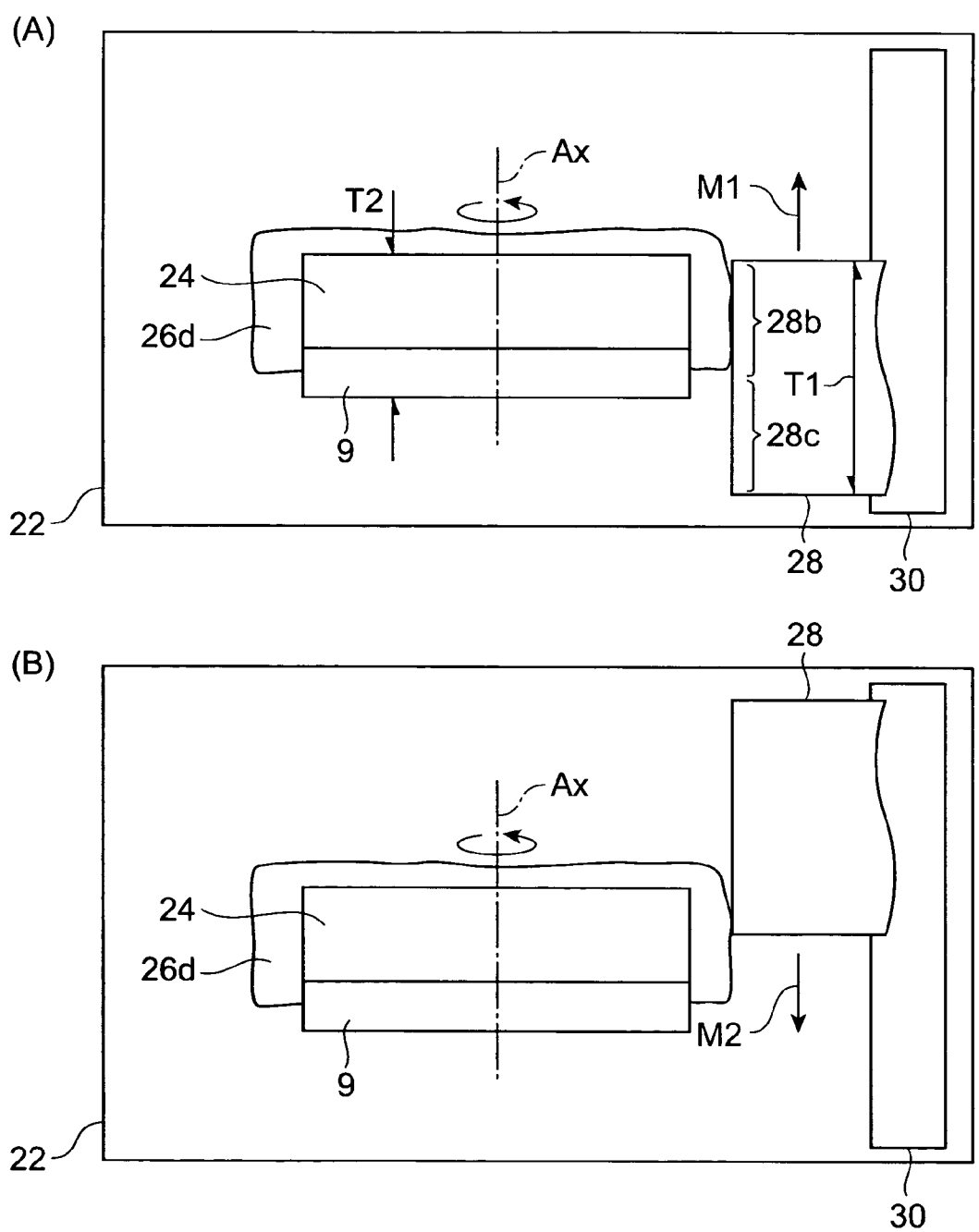
FIG. 5 is a view showing another example of the peripheral processing step, and each of parts (A) and (B) of FIG. 5 shows the peripheral processing step.

Part (A) and part (B) in FIG. 5 show another example of the peripheral processing step. The peripheral processing step removes the nitride deposit 26 by peripheral processing while oscillating one of the GaN crystal body 24 and the grinding wheel 28 relative to the other during a part or the whole of the peripheral processing step. The grinding wheel 28 is supported on an oscillating device 30 so as to be movable in the direction of the predetermined axis Ax.

In the grinding wheel 28 supported on the oscillating device 30, as shown in part (A) in FIG. 5, a first area 28b of grinding surface 28a is first used. The first area 28b of the grinding wheel 28 is in contact with the nitride deposit 26d, and the grinding wheel 28 moves in a direction indicated by arrow M1, so that the second area 28c of the grinding wheel 28 is in contact with the nitride deposit 26d. When the oscillating device 30 moves the grinding wheel 28 to a limit point, the grinding wheel 28 then moves in the opposite direction indicated by an arrow M2, as shown in part (B) in FIG. 5. Almost the whole of the grinding surface 28a is used through such movement. This method uniformly abrades the entire surface of the grinding wheel by oscillating the grinding wheel because the thickness T1 of the grinding wheel 28 is larger than the thickness T2 of the GaN crystal body.

Example 3

A GaN film about 3 mm thick was deposited on a GaAs substrate having the diameter of 50 mm to prepare complex. The outside diameter of the complex was 58 mm because of the nitride deposit. The complex was ground at the peripheral speed of 2000 mm/min with a straight type of diamond grinding wheel (resin bonded grinding wheel) #600. The grinding wheel was oscillated in the thickness direction of the complex, whereby the grinding wheel became uniformly worn.

Figure 6:
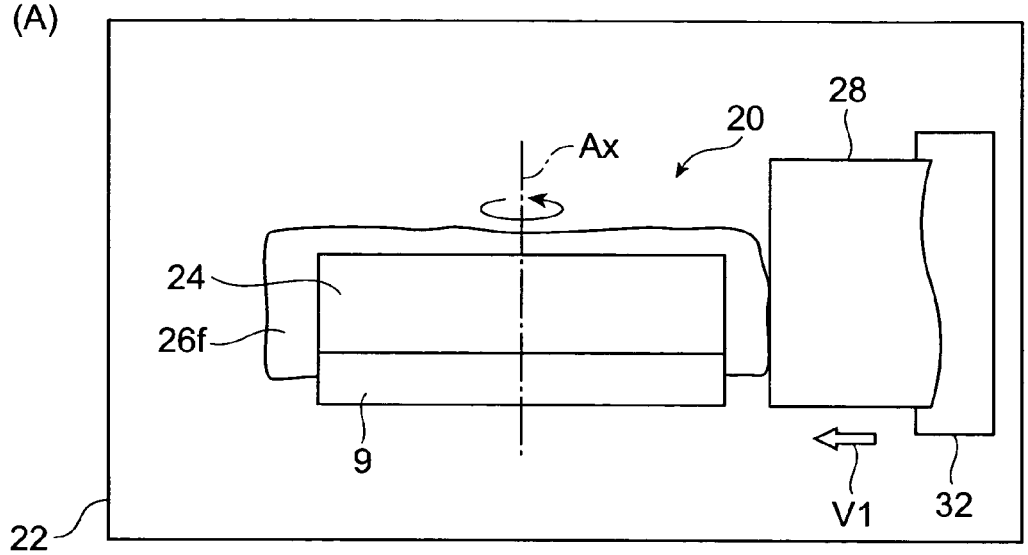
FIG. 6 is a view showing still another example of the peripheral processing step, and each of part (A) and part (B) of FIG. 6 shows the peripheral processing step.
Figure 6:
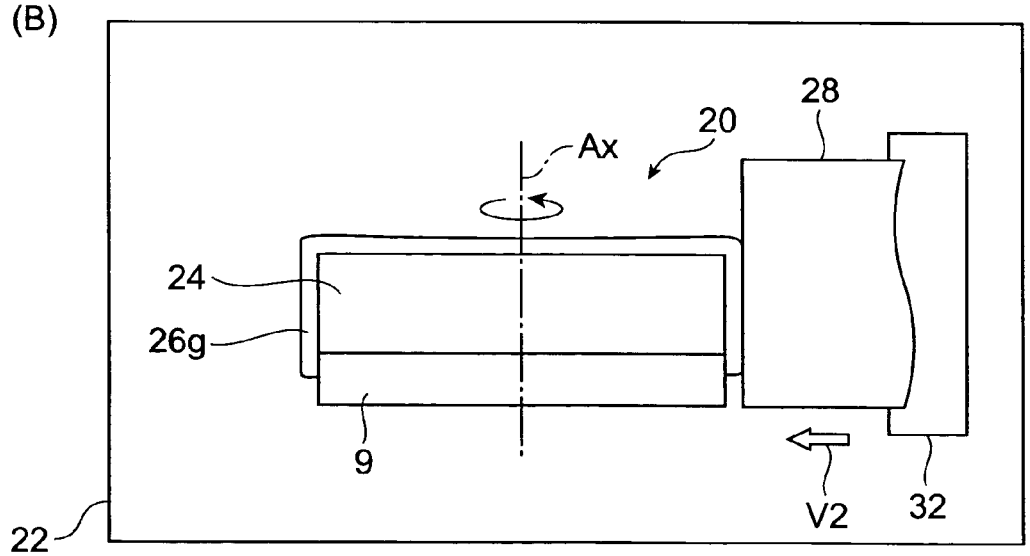

Part (A) and part (B) in FIG. 6 show still another example of the peripheral processing step. The peripheral processing step includes an initial step shown in part (A) of FIG. 6 and a finish step shown in part (B) of FIG. 6. Feed speed of the grinding wheel 28 for grinding of nitride deposit 26f, 26g can be changed by a feeding device 32 installed on the peripheral processor 22. The feed speed V1 of the grinding wheel 28 in the initial step is different from the feed speed V2 of the grinding wheel 28 in the finish step. In a preferred example, the feed speed V2 is smaller than the feed speed V1. For example, the feed speed V1 is preferably equal to or more than 3 mm/Hr and equal to or less than 7 mm/Hr, and the feed speed V2 is preferably equal to or more than 1 mm/Hr and equal to or less than 4 mm/Hr.

According to this method, the inner peripheral region of the nitride deposit is closer to the GaN crystal body that will be processed into products, as compared to the outer peripheral region of the nitride deposit. Therefore, the inner peripheral region and the outer peripheral region are ground at the respective feed speeds changed on that way, so as to reduce damage to products.

Example 4

The peripheral processing of a complex having the diameter of 58 mm was first conducted at the processing feed speed of 5 mm/hr and, when the diameter is decreased to 52 mm in the processing, the processing feed speed was changed to 2 mm/hr and the processing was continued to the diameter of 50 mm. No crack was observed.

In the first to fourth examples described above, since the nitride deposit 26 was removed prior to the separation of the substrate 9 from the GaN crystal body 24, the removal of the nitride deposit 26 can be carried out in the peripheral processing as above.

Comparative Example 1

Figure 7:
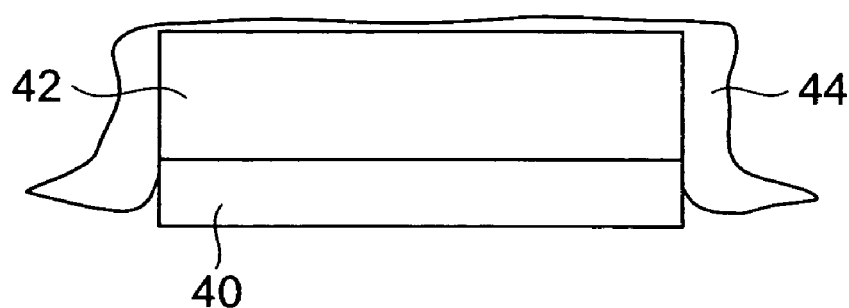
FIG. 7 is a view showing a step of etching a complex in the production method, and each of parts (A) to (C) shows the etching of the complex.
Figure 7:
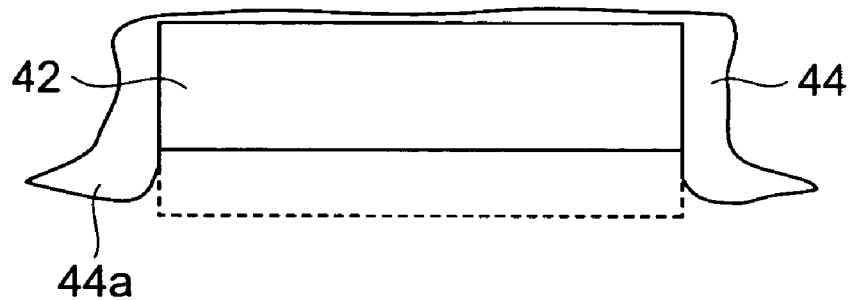
Figure 7:
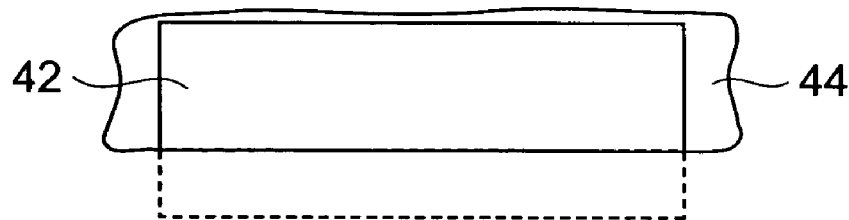

When a GaN thick film 42 was grown on a GaAs substrate 40, deposit 44 was inevitably grown on the periphery of a GaN crystal body having a shape of cylinder of the diameter of 50 mm, so that the diameter of the complex was about 58 mm. As shown in part (A) of FIG. 7, the grown deposit has a variety of shapes, and it had a downwardly spreading shape from the GaN crystal body 42 along the substrate 40. This complex was subjected to etching with aqua regia or the like to remove the GaAs substrate, and the grown deposit (downwardly spreading part 44a), which had been on the side face of the GaAs substrate, was left in the spreading shape as shown in part (B) in FIG. 7. This as-obtained shape does not allow us to shape an independent GaN thick film and to form wafers therefrom. Thus, as shown in part (C) in FIG. 7, it is necessary to remove the spreading portion by a preprocessing. This preprocessing is a work by human power and thus necessitates the time of about 50-80 minutes. For further improvement in productivity, it is desirable to reduce this time. The various methods described in the examples of the present invention can reduce the time for the processing and enhance productivity. By reducing the time for manual processing, it also becomes feasible to avoid breakage of wafers due to handling error or the like during the manual processing.

The present invention is by no means limited to the specific configurations disclosed in the examples of the present invention. A mask having a predetermined pattern can be provided on the substrate, prior to the formation of the GaN crystal body, as occasion may demand. The present invention can also be applied to GaN substrates including single-crystal substrates and composite substrates consisting of a plurality of single crystals.

Subsequently, a method of producing a GaN crystal body and a GaN substrate will be described with reference to the accompanying drawings. This method produces a GaN substrate from a GaN crystal body grown by vapor phase epitaxy on a substrate made of material different from GaN.

Figure 8:
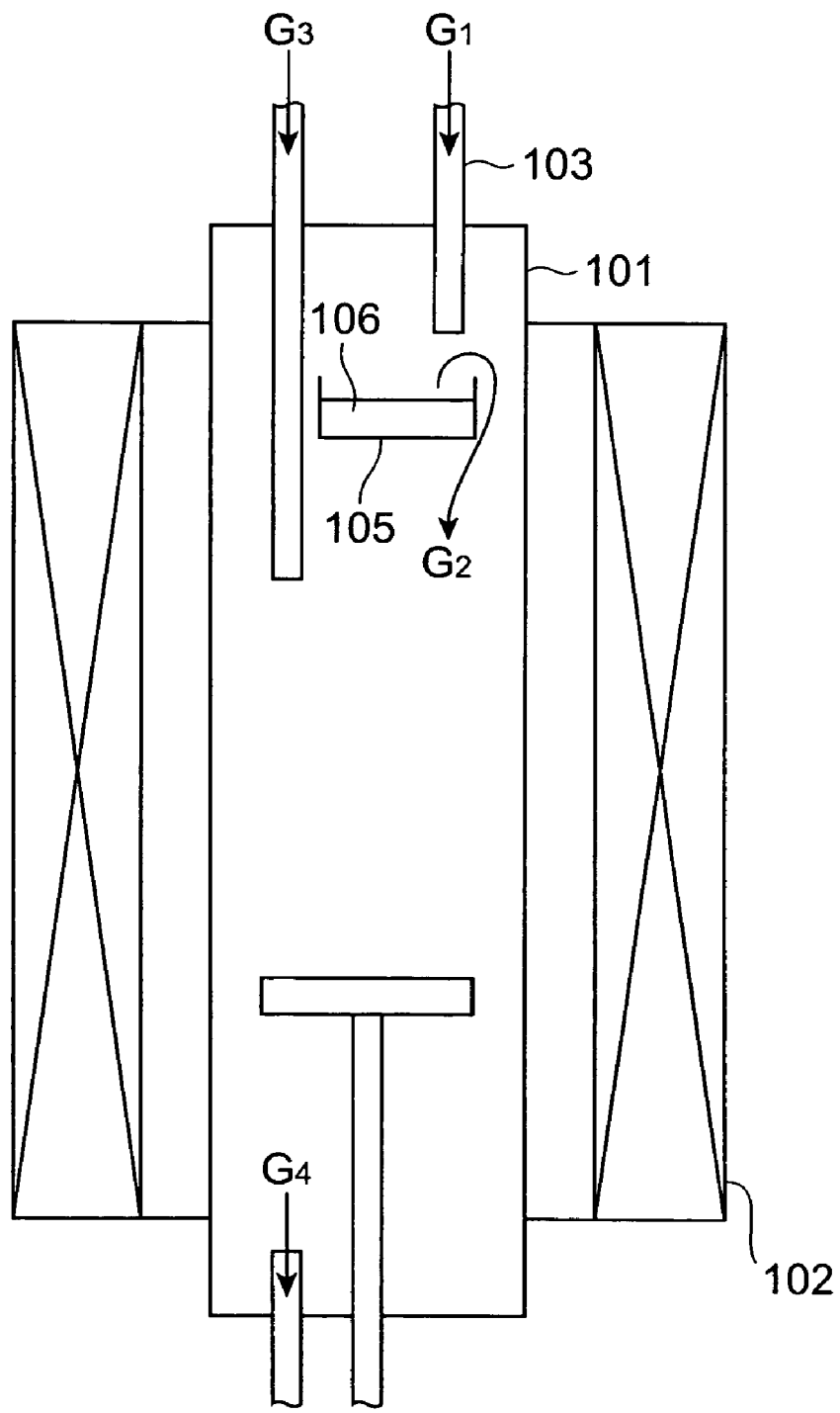
FIG. 8 is a view showing a deposition system for vapor phase epitaxy such as HVPE used for epitaxial growth.

FIG. 8 shows a deposition apparatus for vapor phase epitaxy, such as HVPE, used for epitaxial growth. A vertical reactor 101 is provided in a heater 102 of a cylinder shape. Source gas inlets 103, 104 are provided in the upper wall of the reactor 101. Mixed gas $G_1$ of hydrogen chloride (HCl) as a source gas and hydrogen ($H_2$) as a carrier gas is introduced through the gas inlet 103 into the reactor 101. A gallium (Ga) source 105 in which metal gallium is charged is opposed to the inlet 103. Since metal gallium has a low melting point, it turns into a Ga melt 106 when heated by a heater 102. When HCl is brought into contact with the Ga melt, the following reaction takes place to generate gallium chloride ($GaCl_3$): $2Ga+6HCl \rightarrow 2GaCl_3+3H_2$. Mixed gas $G_2$ of gallium chloride and carrier gas $H_2$ is produced in the reactor 101. Mixed gas $G_3$ of ammonia ($NH_3$)+hydrogen ($H_2$) is introduced through the inlet 104 into the reactor 101. The reaction of $GaCl_3$ and $NH_3$ in the source gas takes place to deposit a GaN thick film for fabrication of a GaN substrate, on a substrate 109.

A susceptor 107 is supported by a shaft 108 so as to enable rotation and up-and-down motion. The substrate, such as a GaAs substrate 109, is placed on the susceptor 107. The GaAs substrate 109 is of inch size and is of an approximate disk shape having the diameter of two inches, for example. Gallium nitride (GaN) is deposited on the primary surface of the substrate 109. Mixed gas $G_4$ of the remainder of the source gas and the reaction product gas is evacuated through waste gas outlet 110. The GaN crystal body grown by HVPE demonstrates the n-conductivity type when undoped. The carrier concentration is, for example, approximately $1 \times 10^{18}$ cm$^{-3}$. After the temperature of the deposition apparatus is lowered to room temperature, the complex of the GaAs substrate 109 and the GaN crystal body grown on this substrate 109 is taken out from the deposition apparatus. The thickness of the GaN crystal body is larger than the thickness of the substrate 109.

Figure 9:
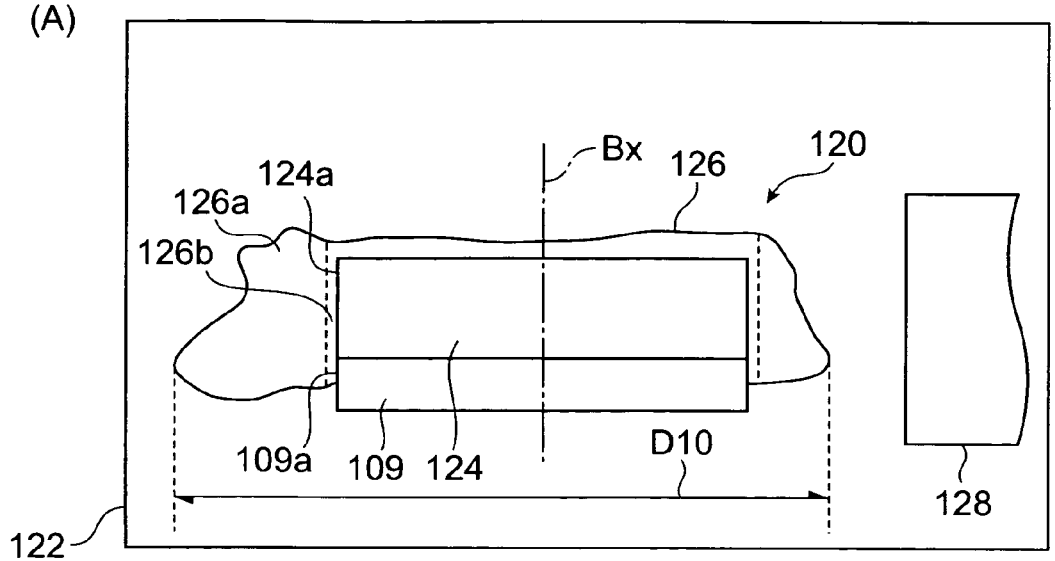
FIG. 9 is a view showing a method of producing a GaN crystal body and a method of producing a GaN substrate. Part (A) shows a peripheral processing apparatus for performing a step of removing a nitride deposit by peripheral processing, part (B) shows a step of removing the nitride deposit, part (C) shows a step of separating the substrate from a GaN crystal body.
Figure 9:
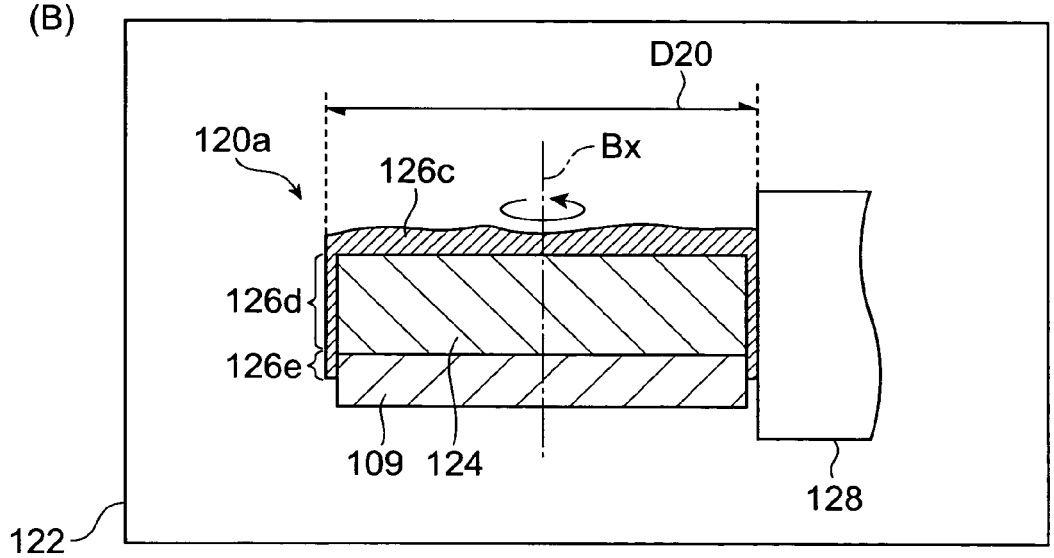
Figure 9:
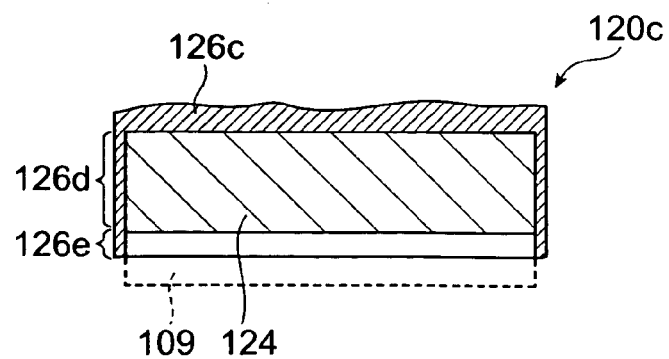

Part (A) of FIG. 9 shows a peripheral processor for performing a step of removing a nitride deposit by peripheral machining. The complex 120 includes a GaAs substrate 109, a GaN crystal body 124, and a nitride deposit 126. For example, the GaN crystal body 124 having the shape of a cylinder is formed on the substrate 109 of the disk shape. In conjunction with the growth of the GaN crystal body 124, the nitride deposit 126 is formed on each of side faces 109a, 124a of the substrate 109 and the GaN crystal body 124. The nitride deposit 126 includes a projection located outside a virtual cylinder shape having the diameter of the substrate 109. The complex 120 is mounted on the peripheral processor 122 so as to be rotatable about a predetermined axis Bx. The peripheral processor 122 has, for example, a grinding wheel 128 as a grinding tool for machining the periphery of the complex 120. The complex 120 has a typical dimension, such as a diameter, indicated by symbol D10. The nitride deposit 126 has an outer periphery part 126a which will be ground by the following peripheral processing step, and an inner periphery part 126b which remains even after this peripheral processing step.

Part (B) of FIG. 9 shows the peripheral processing step. While the complex 120 is rotated about the predetermined axis Bx, the grinding wheel 128 is brought into contact with the periphery of the complex 120. When the grinding wheel 128 is moved at an appropriate feed speed, it is grinding the periphery of the complex 120. Namely, the nitride deposit 126 is gradually removed. In part (B) of FIG. 9, the periphery of the complex 120 is ground to leave the nitride deposit 126c and the diameter of the complex 120 is reduced to dimension D20 (less than D10, D20<D10). The periphery of the complex 120 is ground, for example, to the diameter of 54 millimeters, using the peripheral processor 122. This grinding results in removing the projecting part. In the complex 120a shown of FIG. 9 (B), a small amount of the nitride deposit remains on the side faces of the GaN crystal body 124 and substrate 109. This step removes all the outer periphery part 126a of the nitride deposit 126, while leaving the inner periphery part 126b. For the subsequent description, the nitride deposit 126a left on the side face 124a of the GaN crystal body 124 is referred to as first inner periphery part 126d, and the nitride deposit 126a left on the side face 109a of the substrate 109 is referred to as second inner periphery part 126e.

As shown in part (C) in FIG. 9, the substrate 109 in the complex 120a is removed from the GaN crystal body 124 after the peripheral processing. This removal is carried out by etching to form a complex 120c. Since the substrate 109 is made of GaAs semiconductor in the present embodiment, the substrate 109 can be selectively removed by wet etching with an etchant, such as aqua regia. The complex 120c includes the first inner periphery part 126d left on the side face 124a of the GaN crystal body 124, and the second inner periphery part 126e extending from the first inner periphery part 126d. The second inner periphery part 126e is a wall located along the edge of the GaN crystal body 124, and the height of this wall is approximately equal to the thickness of the substrate 109.

Next, the second inner periphery part 126e is removed from the complex 120c. This step results in eliminating the above wall, which extends from the edge of the GaN crystal body 124, from the complex 120c.

Figure 10:
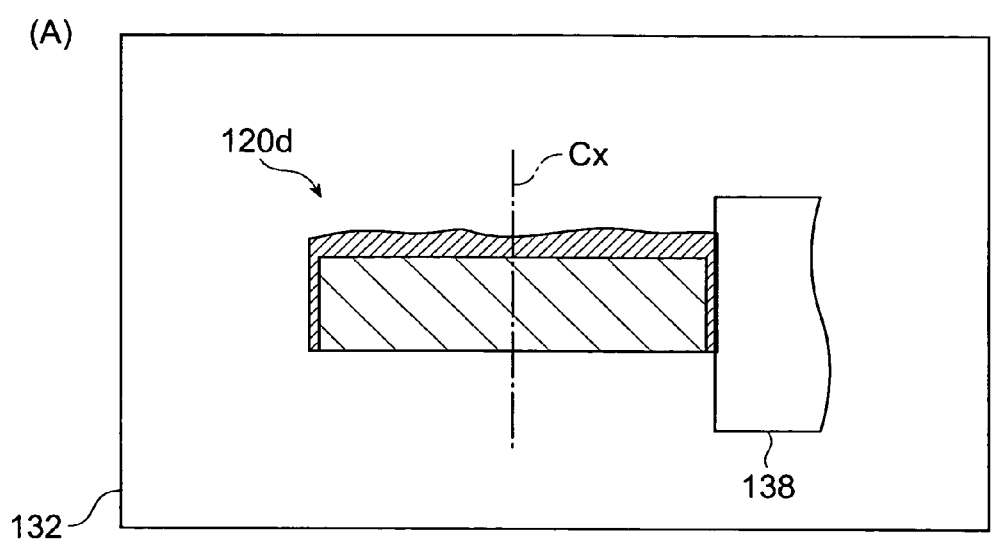
FIG. 10 is a view showing a method of producing a GaN crystal body and a method of producing a GaN substrate, and part (A) shows a step of removing a nitride deposit by peripheral processing and part and (B) shows a GaN crystal body fabricated by an embodiment of the present invention.
Figure 10:
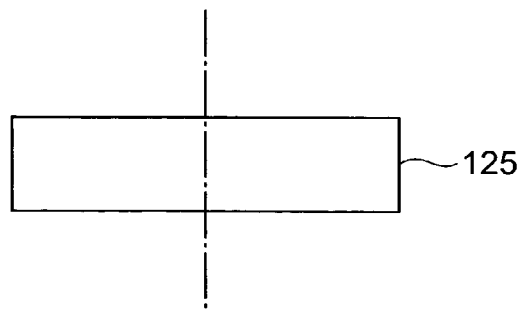

Part (A) of FIG. 10 shows a complex 120d obtained by removing the second inner periphery part 126e from the nitride deposit 126c. This complex 120d is mounted on a peripheral processor 132 so as to be rotated about a predetermined axis Cx. The peripheral processor 132 has a grinding wheel 138 for machining the periphery of the complex 120d. When the complex 120d is rotated about the predetermined axis Cx, the grinding wheel 138 is brought into contact with the periphery of the complex 120c. When the grinding wheel 138 is moved at an appropriate feed speed, the periphery of the complex 120d is ground. The nitride deposit 126 is gradually removed and the first inner periphery part 126d of the nitride deposit 126a is completely removed at last. The periphery of the complex 120 is ground using the peripheral processor 132, for example, to the diameter of 50 millimeters. This step forms a GaN crystal body 125 processed to have the predetermined diameter as shown in part (B) of FIG. 10.

Figure 11:
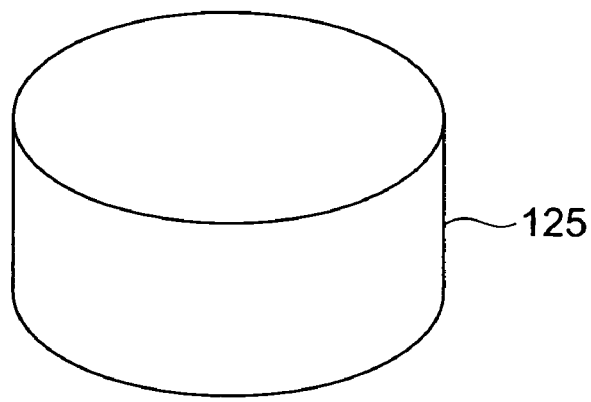
FIG. 11 is a view showing a step of fabricating GaN wafers from a GaN crystal body, and parts (A) and (B) show the step of fabricating the GaN wafers from the GaN crystal body.
Figure 11:
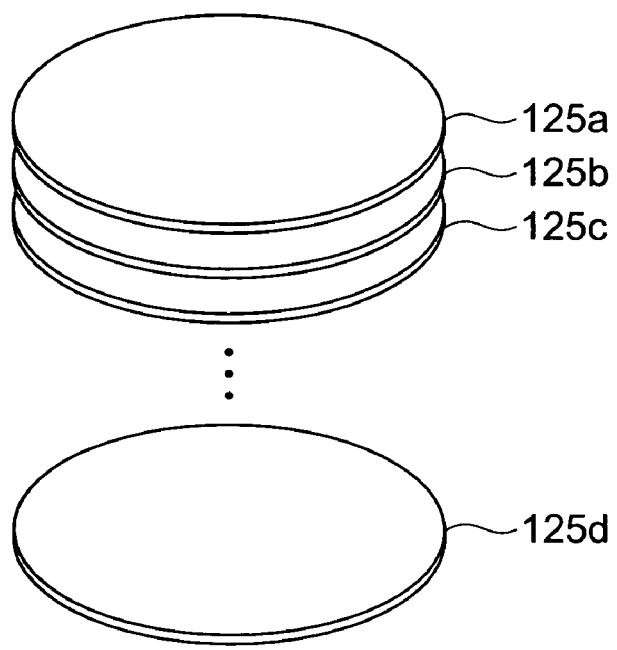

As shown in part (A) of FIG. 11, the GaN crystal body 125 is processed to have a desired diameter, and then it is sliced and polished to form one or more GaN wafers 125a-125d, as shown in part (B) of FIG. 11.

Example 5

GaN was grown on a GaAs substrate having the diameter of 50 mm, and a deposit was also grown on the side face of the GaN crystal body on the GaAs substrate, and the outside diameter of the complex was 58 mm. The GaAs substrate was removed by etching to form a projection on the periphery. If this projection were removed by manual processing, it would take the time of 50 to 80 minutes. This processing time should be shortened in terms of production efficiency. The deposit on the periphery grows in proportion to deposition time and is grown to a bell shape. This bell-shaped downwardly spreading part is preliminary shaved off by peripheral processing, thereby reducing the time required for subsequent processing. The grown deposit was ground to the peripheral diameter of 54 mm. The time necessary for the peripheral processing was approximately 40 minutes. Since this peripheral processing reduced the size of the bell-shaped downwardly spreading part to about half, the time of 25 minutes was taken for the processing of the projecting part after the removal of the GaAs substrate by etching. Therefore, the processing time was shortened. The finished GaN crystal was of a perfect circle, but was decentered by about 1.5 mm and was thus eccentric from the original product part.

Example 6

The peripheral part was processed to the diameter pf 51 mm by a similar method. The peripheral processing took the time of about 70 minutes. After the GaAs substrate was removed, the time of about 5 minutes was taken for the manual processing of the projecting part. The decentering was about 0.9 mm.

FIG. 12 is a drawing showing the eccentricity in the peripheral processing. After the crystal growth, the GaN complex is of a distorted cylinder the outside diameter of which is not always uniform throughout the entire periphery, though it is not a visible level. Therefore, it is not easy to effect accurate centering (to determine a center of a circle) in finishing the periphery to a circle. With poor centering accuracy, a complex formed for final products of a perfect circle is decentered, and a portion of the complex for the final products may be shaved off. In view of centering error, it is thus necessary to finish the complex to a dimension in the peripheral processing slightly larger than the target dimension itself. For fabricating accurate circular wafers from the product, it is desirable to adopt the following process, in terms of ensuring quality as well.

(1) To grind down the complex to a size a little larger than the final diameter in the peripheral processing.

(2) To remove the GaAs substrate by etching.

(3) To remove the remaining bell-shaped projecting part off by processing.

As shown in FIG. 12, investigation was conducted as to present decentering accuracy. An average value of decentering in twelve grinding works was 1.25 mm, and the standard deviation, "sigma," 0.371. In the peripheral processing carried out prior to the etching of the substrate, the upper value of the one sigma range was 1.621 mm (1.25+0.371), and the upper value of the two sigma range was 1.991 mm (1.25+2×0.371).

In the peripheral grinding step carried out prior to the etching of the substrate, the diameter of the ground complex is larger than the diameter of the substrate preferably by a value in the range of equal to or more than 1 mm and equal to or less than 4 mm. If the upper limit can be 4 mm, decentering of two sigma (2*σ) can be permitted.

As a result of further improvement made in the centering method, such as a technique of determining an apparent center with the use of a circular tool circumscribed to the GaN complex, the value of two sigma was decreased to about 1.5 mm. In the peripheral grinding step carried out prior to the etching of the substrate, the diameter of the ground complex is larger than the diameter of the substrate by preferably a value in the range of not less than 1 mm nor more than 3 mm.

In either case, the lower limit is ideally zero millimeters but the lower limit was set to one millimeter. This lower limit prevents the grinding of the GaN crystal body in the peripheral grinding step, and thus the GaN crystal body can be protected from unpredictable damage.

The embodiment of the present invention described above provides a method of producing a GaN crystal body and a method of producing a GaN substrate, by the efficient removal of the nitride deposit formed on the side faces of the substrate and the GaN crystal body for fabrication of GaN substrates.

Comparative Example 2

Figure 13:
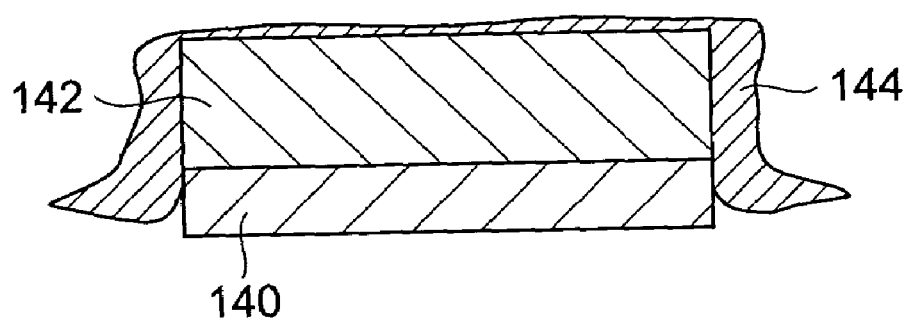
FIG. 13 is a view showing a production method of etching a complex, and parts (A) to (C) show the production method in which the complex is etched.
Figure 13:
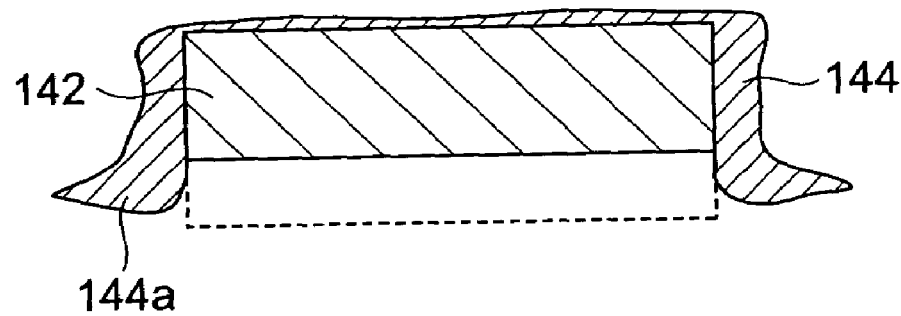
Figure 13:
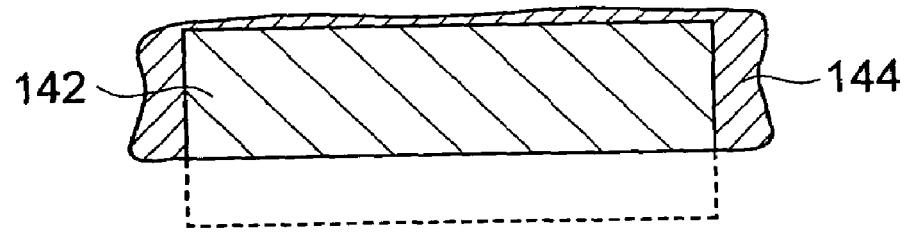

When a GaN thick film 142 was grown on a GaAs substrate 140, a deposit 144 was inevitably grown on the periphery of a GaN crystal body having the shape of a cylinder of the diameter of 50 mm. The maximum outside diameter of the complex was about 58 mm. The grown deposit can have a variety of shapes, and, as shown in part (A) of FIG. 13, it had a downwardly spreading shape from the GaN crystal body 142 along the substrate 140. This complex was subjected to etching with aqua regia or the like to remove the GaAs substrate, and, as shown in part (B) in FIG. 13, the grown deposit (downwardly spreading part) on the side face of the GaAs substrate remains in a projecting shape because the GaAs substrate had been removed. This shape as-obtained does not allow us to form an independent GaN thick film and further to form wafers therefrom. Thus, it is necessary to remove the projecting part by preprocessing, as shown in part (C) of FIG. 13. This preprocessing is a work by human power and necessitates the time of about 50-80 minutes. For further improvement in productivity, it is desirable to shorten this time. The method described in the embodiment of the present invention can reduce the time for the processing and enhance the productivity. By reducing the time for the manual processing, it becomes feasible to avoid breakage of wafers due to handling error or the like during the manual processing.

The principle of the present invention has been illustrated and described in the preferred embodiments, but it is apparent to those skilled in the art that the present invention can be modified in arrangement and details without departing from the principle. The present invention is not limited to the specific configurations disclosed in the embodiments of the present invention. A mask having a predetermined pattern can be provided on the substrate prior to the formation of the GaN crystal body, if necessary. The present invention can also be applied to any one of GaN substrates as single-crystal substrates and composite substrates constituted by the arrangement of a plurality of single crystals. We therefore claim all modifications and variations coming within the spirit and scope of the following claims.

What is claimed is:

1. A method of producing a GaN crystal body for forming a GaN substrate, the GaN crystal body being grown by vapor phase epitaxy on a substrate made of material different from GaN, the growth resulting in forming a nitride deposit on the GaN crystal body and a side face of the substrate, the method comprising the steps of:

grinding a peripheral part of the nitride deposit by machining to remove a first outer periphery part of the nitride deposit on the side face of the GaN crystal body and a second outer periphery part of the nitride deposit on the side face of the substrate, a first inner periphery part of the nitride deposit being left on the side face of the GaN crystal body and a second inner periphery part of the nitride deposit being left on the side face of the substrate;

after the grinding by machining, removing the substrate by etching;

after removing the substrate, removing the second inner periphery part of the nitride deposit; and after the removal of the second inner periphery part, removing the first inner periphery part of the nitride deposit by machining to form the GaN crystal body.

2. The method according to claim 1, wherein, after the peripheral part of the nitride deposit has been ground, the inner periphery part of the nitride deposit and the GaN crystal body have a size within a circular cylinder of a predetermined diameter, the predetermined diameter is larger than a diameter of the substrate, and the difference between the predetermined diameter and the substrate diameter is equal to or more than one millimeter and equal to or less than four millimeters.

3. The method according to claim 1, wherein, after the peripheral part of the nitride deposit has been ground, the inner periphery part of the nitride deposit and the GaN crystal body have a size within a circular cylinder of a predetermined diameter, the predetermined diameter is larger than a diameter of the substrate, and the difference between the predetermined diameter and the substrate diameter is equal to or more than one millimeter and equal to or less than three millimeters.

4. The method according to claim 1, wherein the grinding by machining comprises removing the nitride deposit by use of a grinding stone while rotating the GaN crystal body about a predetermined axis.

5. A method of producing a GaN substrate from a GaN crystal body grown by vapor phase epitaxy on a substrate made of material different from GaN, the growth resulting in forming a nitride deposit on side faces of the GaN crystal body and the substrate, the method comprising the steps of:

grinding a peripheral part of the nitride deposit by machining to remove a first outer periphery part of the nitride deposit on the side face of the GaN crystal body and a second outer periphery part of the nitride deposit on the side face of the substrate, a first inner periphery part of the nitride deposit being left on the side face of the GaN crystal body and a second inner periphery part of the nitride deposit being left on the side face of the substrate;

after the grinding by machining, removing the substrate by etching;

after the removal of the substrate, removing the second inner periphery part of the nitride deposit;

after the removal of the second inner periphery part, removing the first inner periphery part of the nitride deposit by machining to form the GaN crystal body; and fabricating one or more GaN substrates from the GaN crystal body.

* * * * *